(12) United States Patent
Geelen (10) Patent No.: US 10,504,951 B2
(45) Date of Patent: Dec. 10, 2019

(54) IMAGE SENSOR AND IMAGING APPARATUS HAVING AN ARRAY OF INTERFERENCE FILTERS

(71) Applicant: IMEC VZW, Leuven (BE)

(72) Inventor: Bert Geelen, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/101,080

(22) Filed: Aug. 10, 2018

(65) Prior Publication Data

US 2019/0067344 A1    Feb. 28, 2019

(30) Foreign Application Priority Data

Aug. 30, 2017    (EP) ..................................... 17188601

(51) Int. Cl.
*H01L 27/14*    (2006.01)
*H01L 31/02*    (2006.01)
(Continued)

(52) U.S. Cl.
CPC ........ *H01L 27/1462* (2013.01); *G01J 3/0259* (2013.01); *G01J 3/26* (2013.01);
(Continued)

(58) Field of Classification Search
CPC ........... H01L 27/1462; H01L 27/14643; H01L 31/02162; H01L 31/02165; G01J 3/0259;
(Continued)

(56) References Cited

U.S. PATENT DOCUMENTS 3,743,586 A * 7/1973 Vossen .................... C23C 14/35
                                                          204/192.34
7,259,788 B1    8/2007 Olding et al.
(Continued)

FOREIGN PATENT DOCUMENTS

EP          2563012 A1      2/2013
WO      2016/200430 A1    12/2016

OTHER PUBLICATIONS

European Search Report, European Patent Application No. 17188601.3, dated Mar. 16, 2018, 8 pages.

*Primary Examiner* — Ida M Soward
(74) *Attorney, Agent, or Firm* — McDonnell Boehnen Hulbert & Berghoff LLP (57) ABSTRACT

Example embodiments relate to image sensors and imaging apparatuses. One embodiment includes an image sensor for acquiring an image of an object. The image sensor includes an array of photo-sensitive areas formed on a substrate. Each photo-sensitive area is a continuous area within the substrate and is configured to detect incident light. The image sensor also includes an array of interference filters. Each inference filter is configured to selectively transmit a wavelength band. The array of interference filters is monolithically integrated on the array of photo-sensitive areas. A plurality of the interference filers is associated with a single photo-sensitive area of the array of photo-sensitive areas. Each interference filter in the plurality of interference filters is configured to selectively transmit a unique wavelength band to the photo-sensitive area and each interference filter in the plurality of interference filters is associated with a respective portion of the single photo-sensitive area.

20 Claims, 2 Drawing Sheets

(51) Int. Cl.
*G01J 3/02* (2006.01)
*G01J 3/26* (2006.01)
*G01J 3/28* (2006.01)
*G02B 5/20* (2006.01)
*G02B 5/28* (2006.01)
*H01L 27/146* (2006.01)
*H01L 31/0216* (2014.01)

(52) U.S. Cl.
CPC .......... *G01J 3/2823* (2013.01); *G02B 5/201* (2013.01); *H01L 27/14643* (2013.01); *H01L 31/02165* (2013.01); *G01J 2003/2826* (2013.01); *G02B 5/285* (2013.01); *H01L 27/14603* (2013.01)

(58) Field of Classification Search
CPC .......... G01J 3/26; G01J 3/2823; G02B 5/201; G02B 5/28; G02B 5/285
See application file for complete search history.

(56) References Cited

U.S. PATENT DOCUMENTS

| | | | |
|---|---|---|---|
| 7,285,768 B2* | 10/2007 | Tan | G01J 3/51 |
| | | | 250/226 |
| 7,317,531 B2* | 1/2008 | Mieher | G01N 21/956 |
| | | | 356/369 |
| 8,237,121 B2* | 8/2012 | Morin | H01L 27/14625 |
| | | | 250/338.4 |
| 8,624,341 B2* | 1/2014 | Holenarsipur | H01L 27/14621 |
| | | | 257/432 |
| 9,784,823 B2* | 10/2017 | Beche | G01S 7/495 |
| 9,883,149 B2* | 1/2018 | Vogelsong | H04N 9/045 |
| 9,972,727 B2* | 5/2018 | Sik | H01L 27/1446 |
| 2008/0123097 A1 | 5/2008 | Muhammed et al. | |
| 2011/0141569 A1 | 6/2011 | Wehne | |
| 2015/0131090 A1* | 5/2015 | Osumi | G01J 3/504 |
| | | | 356/300 |
| 2015/0276478 A1 | 10/2015 | Geelen et al. | |
| 2017/0070709 A1 | 3/2017 | Sato et al. | |
| 2018/0170093 A1* | 6/2018 | Najiminaini | G02B 5/201 |

* cited by examiner

IMAGE SENSOR AND IMAGING APPARATUS HAVING AN ARRAY OF INTERFERENCE FILTERS

CROSS-REFERENCE TO RELATED APPLICATIONS

The present application is a non-provisional patent application claiming priority to European Patent Application No. EP 17188601.3, filed Aug. 30, 2017, the contents of which are hereby incorporated by reference.

FIELD OF THE DISCLOSURE

The present disclosure relates to an image sensor for acquiring an image of an object. In particular, the present disclosure relates to acquiring an image including spectral information.

BACKGROUND

In many applications, it is desired to acquire spectral images of an object. Spectral imaging implies that the spectral content of an image of the object is extracted and incident electro-magnetic radiation relating to multiple narrow ranges of wavelengths is detected. The spectral imaging may for instance be used in analysis of imaged objects, such as for determination whether a substance having a specific spectral profile is present in the object.

The terms multi-spectral imaging and hyperspectral imaging are often used. These terms do not have established definitions, but typically multi-spectral imaging refers to spectral imaging using a plurality of discrete wavelength bands, whereas hyperspectral imaging refers to imaging narrow spectral wavelength bands over a continuous spectral range. Hyperspectral imaging may also often use a larger number of spectral bands than what is used in multi-spectral imaging.

With advances to semiconductor fabrication, it is now possible to produce image sensors based on complementary metal-oxide-semiconductor (CMOS) technology, wherein a substrate comprising an array of photo-sensitive areas is integrated with filters for selectively transmitting light to the photo-sensitive areas.

The integrated filters may define different wavelength bands associated with different photo-sensitive areas. For instance, spectral bands may be associated with different rows of photo-sensitive areas, such that when a line-scan is performed an image of high spectral and spatial resolution may be acquired. Alternatively, a mosaic configuration of wavelength bands may be arranged on the array of photo-sensitive areas, such that a set of photo-sensitive areas is associated with a plurality of filters and may together acquire spectral information of a portion of an object. An image sensor having a mosaic configuration of filters may be used for acquiring an image with a spectral resolution in a single exposure (snapshot). However, a spatial resolution of the image will be limited to a combined size of the set of photo-sensitive areas associated with the plurality of filters. Also, other set-ups of an image sensor for acquiring images having spectral resolution may be used.

A filter defining a wavelength detected by a photo-sensitive area may define a central wavelength and a bandwidth around the central wavelength, which will be transmitted to the photo-sensitive area with which the filter is associated. A bandwidth of the transmitted light may be defined by a full width at half maximum (FWHM), i.e., a range of wavelengths for which at least half the intensity of the maximum intensity of transmitted light for the central wavelength will be transmitted to the photo-sensitive area.

However, the bandwidth may depend on materials used in the filter, such that the FWHM value may be larger for longer wavelengths. This implies that the selective detection of wavelengths may be different longer wavelengths. In some applications, the filters may provide a similar bandwidth for all wavelengths that are to be detected by the image sensor. Therefore, the image sensor may be configured in a flexible manner for defining characteristics of light transmitted to the photo-sensitive areas of the image sensor.

SUMMARY

Some embodiments may provide an image sensor which may be flexibly and variably designed in order to provide desired characteristics of light transmitted to photo-sensitive areas. Additional embodiments are set out in the dependent claims.

According to a first aspect, there is provided an image sensor for acquiring an image of an object, the image sensor comprising: an array of photo-sensitive areas formed on a substrate, wherein each photo-sensitive area is a continuous area within the substrate and wherein each photo-sensitive area is configured to detect incident light; an array of interference filters, wherein each interference filter is configured to selectively transmit a wavelength band, wherein the array of interference filters is monolithically integrated on the array of photo-sensitive areas; and wherein a plurality of interference filters is associated with a single photo-sensitive area, wherein each interference filter in the plurality of interference filters is configured to selectively transmit a unique wavelength band to the photo-sensitive area and each interference filter in the plurality of interference filters is associated with a respective portion of the photo-sensitive area.

According to example embodiments, a convention of having a single filter associated with a single pixel or photo-sensitive area is abandoned. This allows for flexibly and variably designing the characteristics of light being transmitted to the single photo-sensitive area.

The single photo-sensitive area is a continuous area within the substrate. Hence, in contrast to image sensors having plural photo-sensitive areas which are associated with different filters, wherein the information from the plural photo-sensitive areas may be combined in post-processing of the detected light intensities to form a single pixel value, the present disclosure provides a plurality of filters associated with a single area. This implies that a very compact arrangement of the filters is enabled, as the different respective portions of the photo-sensitive area need not be associated with read-out circuitry. Rather, a single value may be read out from the entire photo-sensitive area.

A substrate comprising the array of photo-sensitive areas may be manufactured in large volumes enabling the substrate with the photo-sensitive areas to be produced very cheaply. Thus, the image sensor with interference filters integrated on the array of photo-sensitive areas may be formed based on a substrate manufactured for a general purpose. Hence, a manufacturer of the image sensor may not be able to freely choose a pixel pitch or other arrangement of the pixels on the substrate. The use of a plurality of interference filters associated with a single photo-sensitive area therefore also provides a flexibility to design characteristics of light being transmitted to the array of photo-sensitive areas, wherein the design is not bound to the layout of pixels on the substrate.

The plurality of interference filters may allow designing the characteristics of light transmitted to the photo-sensitive area in a more flexible manner than possible using a single filter associated with the photo-sensitive area. For instance, a FWHM of the transmitted wavelength may be accurately controlled. In other applications, a spectrum of discrete wavelengths transmitted to the photo-sensitive area may be controlled.

Complementary Metal-Oxide-Semiconductor (CMOS) fabrication technology allows production of very small size layer structures. Thus, it is possible with CMOS fabrication technology to create filters integrated with a substrate comprising photo-sensitive areas, wherein a plurality of different filters may be associated with a single photo-sensitive area without a size of the photo-sensitive area being very large. For instance, for a pixel pitch of 16 μm, it may be possible to provide 2×2 interference filters on a single photo-sensitive area.

As used herein, the term "plurality of interference filters" should be construed as at least two interference filters. In some embodiments, two interference filters are associated with a single photo-sensitive area. In other embodiments, more than two interference filters are associated with a single photo-sensitive area.

According to an embodiment, the respective portions of the photo-sensitive area are equally large. This implies that each of the interference filters associated with a single photo-sensitive area is associated with an equally large portion of the photo-sensitive area. This may correspond to the wavelength selected by each of the interference filters equally contributing to an intensity of light detected by the interference filter. Also, the respective portions being equally large implies that a regular pattern may be defined by the plurality of interference filters, which may facilitate production of the image sensor.

It should also be realized that in other embodiments, the respective portions of the photo-sensitive area may not be equally large. For instance, the sensitivity of the photo-sensitive area to incoming light may be dependent on wavelength. Thus, in order for each unique wavelength band defined by the plurality of interference filters to equally contribute to the detected intensity, the respective portions may have different sizes (especially if the unique wavelength bands differ substantially). Also, in some embodiments, it may be desired that the contribution of different wavelength bands to the detected intensity differs and the respective portions may, for such reason, be of different sizes.

It should also be realized that a plurality of respective portions of the photo-sensitive area may be associated with identical interference filters. Hence, the image sensor may be provided with a plurality of interference filters associated with a single photo-sensitive area, wherein each of the interference filters in the plurality of interference filters is unique and, in addition to the unique interference filters, one (or more) additional interference filter which is identical with one of the interference filters in the plurality of interference filters is associated with a respective portion of the photo-sensitive area. For instance, the photo-sensitive area may comprise four respective portions, wherein two respective portions are associated with identical interference filters. This may be used, e.g., if it is desired that a contribution of a wavelength transmitted by an interference filter is to be larger than a contribution of other wavelengths. Instead of making the respective portion of the photo-sensitive area dedicated to this wavelength larger, more than one respective portion may be associated with identical interference filters. This may in some instances be beneficial for production of the image sensor, as a set-up using equal sizes of the portions of the filters could be used.

According to an embodiment, the plurality of interference filters is arranged in a sub-array associated with the single photo-sensitive area. The sub-array may thus constitute a portion of the array of interference filters. This implies that the plurality of interference filters may be arranged in columns and rows on the single photo-sensitive area. Such a configuration may provide a regular pattern of the plurality of interference filters, which may facilitate production of the image sensor.

According to an embodiment, the plurality of interference filters is arranged in a 2×2 set-up of the sub-array. A 2×2 set-up may allow a large degree of freedom in designing the sensitivity of the photo-sensitive area to light, whereas a complexity of a configuration of the array of filters is still moderate. Further, a 2×2 set-up may be possible to produce while maintaining a relatively small pixel pitch of the image sensor.

According to an embodiment, a plurality of interference filters is associated with each single photo-sensitive area in the array of photo-sensitive areas. Hence, a sensitivity to wavelengths for each photo-sensitive area may be controlled by a plurality of interference filters. This may for instance be useful if the plurality of interference filters is used for controlling a combined bandwidth of the light transmitted to the photo-sensitive area.

According to an embodiment, a plurality of interference filters is associated with each of a first set of photo-sensitive areas, and a single interference filter is associated with each of a second set of photo-sensitive areas. Hence, the image sensor need not necessarily comprise a plurality of interference filters for each single photo-sensitive area. On the contrary, a photo-sensitive area in the second set may be associated with only a single interference filter. For some pixels, it may not be necessary to control the wavelengths detected by a plurality of interference filters and a single interference filter may be sufficient. The first and second set of photo-sensitive area may be intermixed in the array of photo-sensitive areas or may form distinct, separate parts of the array of photo-sensitive areas.

According to an embodiment, wavelength transmission characteristics of the plurality of interference filters associated with a first photo-sensitive area is different from wavelength transmission characteristics of the plurality of interference filters associated with a second photo-sensitive area. Hence, the plurality of interference filters may individually control the wavelengths detected by the photo-sensitive areas, such that different configurations of the plurality of interference filters for different photo-sensitive areas may ensure that the wavelength transmission characteristics differ. This implies that an accurate control of the wavelengths detected by each of the photo-sensitive areas may be provided.

According to an embodiment, the single photo-sensitive area is configured to output a single value based on intensity of detected light transmitted to the single photo-sensitive area by the plurality of interference filters. Thus, the single photo-sensitive area may detect a combined intensity of light transmitted by the plurality of interference filters and may not differentiate between the light transmitted through different interference filters in the plurality of interference filters. Hence, a combined single value of light intensity may be output, which may only be associated with noise of a single read-out. This implies that the detected intensity based on a combination of wavelength filters may be acquired with a large signal-to-noise ratio compared to each respective portion of the photo-sensitive area being formed as a separate pixel with separate read-out circuitry.

According to an embodiment, each interference filter comprises a plurality of thin film layers. The plurality of thin film layers may in combination provide a desired wavelength transmission characteristic by transmitting light based on constructive interference of light paths subject to different numbers of reflections in interfaces in a stack of thin film layers. Since transmitted wavelengths may be selected based on reflections, the thin film layers need not absorb light and the interference filter will not risk to be heated due to absorption of light.

According to an embodiment, the plurality of thin film layers form two stacks of layers configured to reflect light, and a transparent layer arranged between the two stacks of layers, wherein a thickness of the transparent layer defines the wavelength band transmitted by the interference filter. Thus, the transmitted wavelength may be defined based on the thickness of the transparent layer. The interference filter may thus be implemented as a so-called Fabry-Perot filter with each of the reflective stacks of layers forming a Bragg reflector.

According to an embodiment, the plurality of interference filters together defines a continuous wavelength band transmitted to the photo-sensitive area and control a bandwidth of the continuous wavelength band around a central wavelength. Thus, the unique wavelength bands of the interference filters in the plurality of interference filter may be overlapping so as together define a continuous wavelength band. The continuous wavelength band may allow detecting a broader bandwidth than may be allowed by using a single filter.

According to an embodiment, the array of interference filters is configured to define different continuous wavelength bands being transmitted to different photo-sensitive areas, wherein the plurality of interference filters associated with each single photo-sensitive area is configured to control the bandwidth of the continuous wavelength band such that equal bandwidths are defined for the different photo-sensitive areas. Thus, an image sensor may be defined which enables detecting a spectrally resolved image, wherein each wavelength band is detected with an equal bandwidth.

According to an embodiment, the plurality of interference filters defines a spectrum of discrete wavelength bands being transmitted to the photo-sensitive area. Thus, the photo-sensitive area may detect a combination of different wavelengths. This could be used for detecting presence of a substance at an object position imaged onto the photo-sensitive area, as the combination of wavelengths may be correlated, e.g., to reflection characteristics of the substance. In such case, the plurality of interference filters may be identical for all photo-sensitive areas and may image an object so as to identify locations in the object where the substance is present.

According to an embodiment, a plurality of interference filters is associated with each of a set of photo-sensitive areas, and the spectrum of discrete wavelength bands transmitted to the photo-sensitive areas varies randomly between different photo-sensitive areas.

This may be used, e.g., for a compressive sensing application, wherein the randomly varying combination of wavelength bands detected by the photo-sensitive areas allows detecting spectral information of an object using a small number of photo-sensitive areas. Thus, randomized spectral sampling for spectral compressive sensing application may be enabled in a compact manner.

According to a second aspect, there is provided an imaging apparatus comprising the image sensor according to the first aspect. Thus, the image sensor may be integrated into an imaging apparatus for acquiring an image of an object. The imaging apparatus may for instance further comprise an optical system for forming an image of an object onto an image plane in which the image sensor may be arranged.

Effects and features of this second aspect are largely analogous to those described above in connection with the first aspect. Embodiments mentioned in relation to the first aspect are largely compatible with the second aspect.

BRIEF DESCRIPTION OF THE DRAWINGS

The above, as well as additional features, will be better understood through the following illustrative and non-limiting detailed description, with reference to the appended drawings. In the drawings, like reference numerals will be used for like elements unless stated otherwise.

DETAILED DESCRIPTION

Detailed embodiments will now be described with reference to the drawings.

Figure 1:
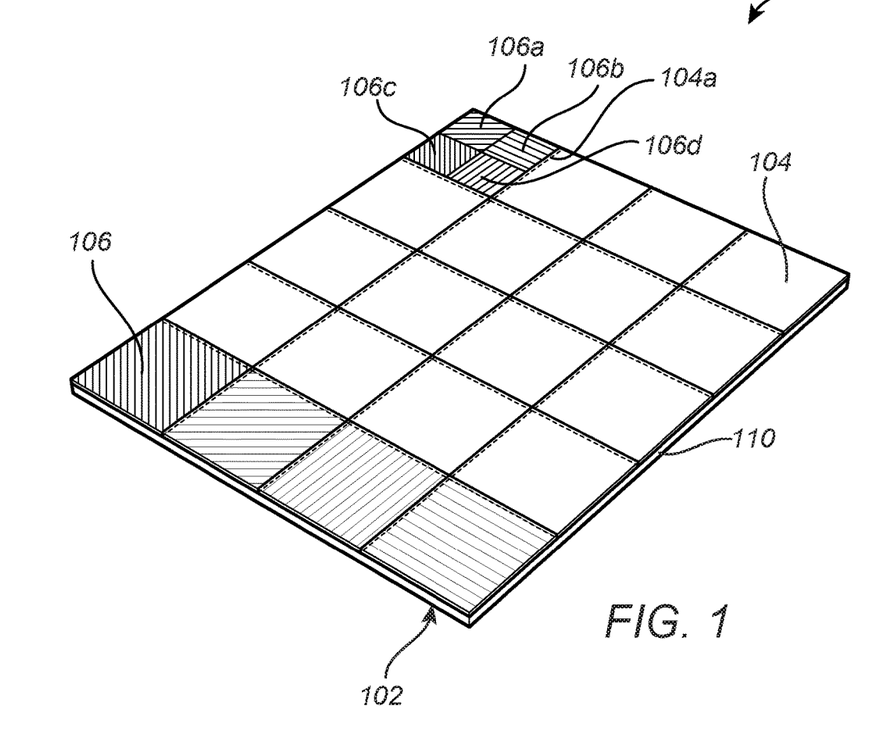
FIG. 1 is a schematic view of an image sensor, according to example embodiments.

Referring now to FIG. 1, an image sensor 100 will be described. The image sensor 100 may be used for acquiring an image of an object and a configuration of the image sensor 100 may allow flexibly designing characteristics of detecting wavelength information in images.

The image sensor 100 may be based on a complementary metal-oxide-semiconductor (CMOS) structure. The CMOS structure may comprise an array 102 of photo-sensitive areas 104 and may further comprise circuitry, e.g., for reading out detected light intensities in the photo-sensitive areas 104 and for timing accumulation of light in the light-detecting elements. The CMOS structure may also comprise circuitry for processing the detected light intensities, such as analog-to-digital converters (ADC) and/or other processing components. The CMOS structure may thus provide a possibility of detecting light intensities and outputting an image representation, e.g., in the form of digital values of the light intensities detected by each photo-sensitive area 104 in the array 102.

The photo-sensitive areas 104 may be arranged to accumulate charges in dependence of light incident on the photo-sensitive area 104. The photo-sensitive area 104 may thus comprise, e.g., a photodiode or a photo-transistor.

The array 102 may comprise identical photo-sensitive areas 104 which are arranged in rows and columns in order to form a two-dimensional array 102. The CMOS structure comprising the array 102 may thus be relatively simple and may also be useful for a number of different applications. This implies that chips carrying the array 102 with an associated read-out and control circuitry may be manufactured in large volumes and may therefore be produced inexpensively. Thus, the image sensor 100 may be formed based on a mass-manufactured CMOS structure.

The array 102 with associated circuitry may be formed on a substrate 110, wherein desired functionality of the CMOS structure may be achieved by forming a plurality of layers on the substrate 110. A thickness of the substrate 110 may then be reduced, such that illumination may fall on the photo-sensitive areas 104 through the substrate 110, so-called backside illumination. This implies that the light will not need to pass layers arranged on the CMOS structure, e.g., for readout and, hence, losses of light due to reflections or absorptions in such layers may be avoided. Thus, backside illumination may provide a possibility to detect as much light as possible, enabling imaging with a high quality.

The image sensor 100 further comprises an array of interference filters 106 arranged on the array of photo-sensitive areas 104 so that light passes through the array of interference filters 106 before reaching the photo-sensitive areas 104. Each interference filter 106 may be configured to selectively transmit a wavelength band of incident light so as to control the wavelength characteristics of light detected by the photo-sensitive area 104 under the interference filter 106.

The array of interference filters 106 may be configured so as to associate interference filters 106 with photo-sensitive areas 104. A single interference filter 106 may extend over a relatively large area spanning several photo-sensitive areas 104 so as to define common wavelength characteristics for several adjacent photo-sensitive areas 104. However, as illustrated in FIG. 1 by different hatchings of the interference filters 106, the interference filters 106 may be arranged in a mosaic configuration such that adjacent photo-sensitive areas 104 may have different interference filters 106 so as to detect different wavelength information.

A pattern of interference filters 106 may be repeated across columns and rows of the array of interference filters 106 such that spectral information may be acquired by a set of photo-sensitive areas 104 associated with one pattern of interference filters 106 and allowing forming a spectrally resolved image with each image point being represented by a set of photo-sensitive areas 104.

The array of interference filters 106 may be monolithically integrated on the array 102 of photo-sensitive areas 104. This implies that the interference filters 106 are fixedly associated with the photo-sensitive areas 104 and that a relation between the interference filters 106 and the photo-sensitive areas 104 will not be altered after the image sensor 100 has been manufactured.

Further, the array of interference filters 106 may be produced on the array 102 of photo-sensitive areas 104 using CMOS manufacturing processes, such as selective depositing and etching of layers in order to form the array of interference filters 106. This may be beneficially used with a CMOS substrate 110 providing the array 102 of photo-sensitive areas 104.

As illustrated for photo-sensitive area 104a, a plurality of interference filters 106a, 106b, 106c, 106d may be associated with a single photo-sensitive area 104a. Each interference filter 106a-d in the plurality of interference filters is configured to selectively transmit a unique wavelength band to the photo-sensitive area 104a. Thus, each of the plurality of interference filters 106a-d may be associated with a respective portion of the photo-sensitive area 104a.

The plurality of interference filters 106a-d collectively defines the wavelength characteristics of light detected by the photo-sensitive area 104a. This provides flexibility in design of the wavelength characteristics of light detected by the photo-sensitive area 104a, since a plurality of interference filters 106a-d may be used for defining the wavelength characteristics. This may be used in several different manners as will be further explained below.

The photo-sensitive area 104a detects incident light and may not differentiate between the contribution of light transmitted by different interference filters in the plurality of interference filters 106a-d. On the contrary, the photo-sensitive area 104a may output a single value which is indicative of a combination of light intensities transmitted by the plurality of interference filters 106a-d.

The respective portions of the photo-sensitive area 104a may be equally large, which corresponds to each of the interference filters in the plurality of interference filters 106a-d having an equally large size. Thus, the photo-sensitive area 104a may have an equally large portion dedicated to each of the unique wavelength bands, which may allow light in the different unique wavelength bands to contribute equally to the light detected in the photo-sensitive area 104a.

However, the photo-sensitive area 104a may not convert incident light to an accumulated charge in a consistent manner for different wavelengths. Hence, in some embodiments, the respective portions may not be equally large, e.g., in order to compensate for the wavelength dependence on sensitivity of the photo-sensitive area 104a, especially if the unique wavelength bands differ substantially. Also, in some embodiments, the contribution of the different wavelength bands may not be equal in the photo-sensitive area 104a.

In many applications, having equally sized respective portions may imply that the contribution of the wavelength bands to the detected light is at least approximately the same. Also, having equally sized respective portions may facilitate manufacturing of the image sensor 100 as each of the interference filters 106a-d in the plurality of interference filters has an equal size and a regular pattern may be formed by the plurality of interference filters 106a-d.

As shown in FIG. 1, the plurality of interference filters 106a-d may be arranged in a 2×2 configuration on the photo-sensitive area 104a. This may be a suitable configuration for dividing the photo-sensitive area 104a into respective portions of equal sizes while having a pattern that facilitates manufacturing. As the photo-sensitive area 104a may typically have a square size, providing a 2×2 configuration implies that each of the interference filters 106a-d may also be square having an equal extension along rows and columns of the array of interference filters 106.

Further, a 2×2 configuration may be a suitable compromise between having a plurality of interference filters 106a-d associated with a single photo-sensitive area 104a and not requiring an extensive size of the photo-sensitive area 104a in order to allow manufacturing of the small individual filters that are to be associated with the photo-sensitive area 104a.

A plurality of interference filters 106a-d may be associated with each of the photo-sensitive areas 104. Thus, the wavelength characteristics of each photo-sensitive area 104 may be accurately controlled using a plurality of interference filters 106a-d. The plurality of interference filters 106a-d may have different set-ups or configurations for different photo-sensitive areas 104 such that different wavelength characteristics may be defined for different photo-sensitive areas 104.

However, it should also be realized that some of the photo-sensitive areas 104 may be associated with a plurality of interference filters 106a-d, whereas other photo-sensitive areas 104 are associated with a single interference filter 106 (or even an interference filter that may be shared by several adjacent photo-sensitive areas 104). A layout of the interference filters 106 may be varied depending on needs for an application in which the image sensor 100 will be used.

For instance, the image sensor 100 may be configured to detect a spectrally resolved image, wherein each wavelength band is detected with an equal bandwidth. The bandwidth of the transmitted light may be defined by a full width at half maximum (FWHM), i.e., a range of wavelengths for which at least half the intensity of the maximum intensity of transmitted light for a central wavelength will be transmitted to the photo-sensitive area 104. The FWHM provided by an interference filter may larger for longer wavelengths. However, using a plurality of interference filters 106a-d associated with a single photo-sensitive area 104, the FWHM may be increased so that the FWHM may be controlled. Thus, for the longest wavelength to be detected by the image sensor 100, a single interference filter may be used, such that as narrow FWHM as possible is used for that wavelength. This FWHM for the longest wavelength may define a target FWHM to be used for all photo-sensitive areas 104. Thus, for photo-sensitive areas 104 being configured to detect other central wavelengths, a plurality of interference filters 106a-d may be arranged on the photo-sensitive area 104 such that the target FWHM is achieved. Hence, the number of interference filters 106 to be associated with a photo-sensitive area 104 may depend on which central wavelength is to be detected by the photo-sensitive area 104.

Likewise, in other applications, a non-uniform FWHM may be used for different central wavelengths. For instance, if the image sensor 100 is used for detecting a specific substance, e.g., chlorophyll, a narrow FWHM may be used for photo-sensitive areas 104 that are configured to detect wavelengths corresponding to a narrow reflectance peak of the substance. Thus, for such photo-sensitive areas 104, a single interference filter 106 may be used. However, in spectral regions where reflectance of the substance is flatter, a spectral resolution need not be as high, and a photo-sensitive area 104 may be associated with a plurality of interference filters 106a-d in order to define a broader FWHM.

Figure 2:
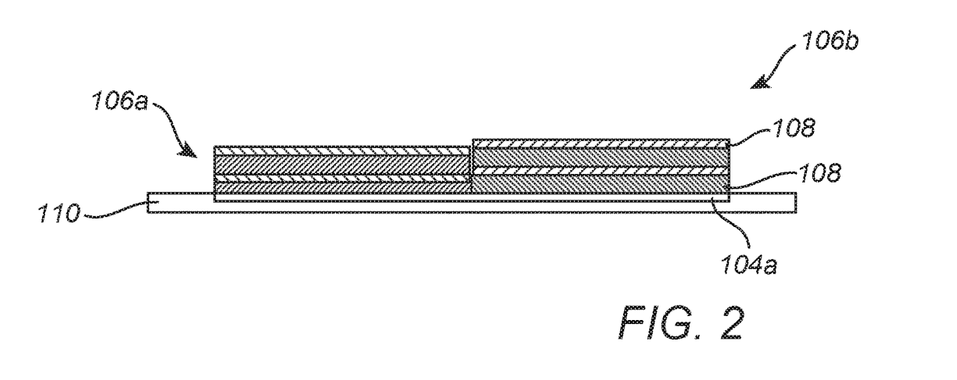
FIG. 2 is a cross-sectional view of a photo-sensitive area with associated interference filters of the image sensor, according to example embodiments.

FIG. 2 shows a cross-section of the photo-sensitive area 104a and two of the plurality of interference filters 106a and 106b arranged on the photo-sensitive area 104a.

The photo-sensitive area 104a forms a continuous area in the substrate 110 sensitive to incoming light. The interference filters 106a and 106b are arranged side-by-side on the single continuous area.

Each of the interference filters 106a, 106b comprises a stack of thin film layers 108. The stack of thin film layers 108 may comprise alternating layers of materials having different refractive indices. Light is reflected in the interfaces between the thin film layers 108 of different refractive index so as to create constructive interference for specific wavelengths of light having travelled different path lengths through the thin film layers 108 corresponding to being reflected different number of times in the interfaces. By selection of thickness and materials of the thin film layers 108, the wavelength transmission characteristics of the interference filter 106 may be controlled.

The interference filters 106a and 106b may be formed using the same materials and providing different thicknesses of at least some of the thin film layers 108 in order to have different wavelength transmission characteristics for the different interference filters 106a and 106b. This implies that the interference filters 106a and 106b may be produced in parallel processes, wherein a first layer is formed for both interference filters 106a and 106b before a second layer is deposited on top of the first layer.

The wavelength transmission characteristics may be defined by the stack of thin film layers 108 defining constructive interference for a wavelength band.

According to another embodiment, the plurality of thin film layers 108 may implement a Fabry-Perot filter. Thus, the plurality of thin film layers 108 may form two stacks of layers configured to reflect light, and a transparent layer arranged between the two stacks of layers. The two stacks of layers may form Bragg reflectors and may be configured to substantially reflect all light over a broad range of wavelengths. The thickness of the transparent layer defines the wavelength band transmitted by the interference filter 106 by the thickness of the transparent layer being a multiple of a wavelength to be transmitted by the interference filter 106.

Since the different interference filters 106a and 106b may be small and close to each other (to be arranged on the same photo-sensitive area 104a), a complexity of the interference filters 106a and 106b may be limited. For instance, the interference filters 106a and 106b may be formed from approximately 20 layers or fewer. Having relatively similar interference filters 106a and 106b (e.g., defining wavelength bands close to each other or partly overlapping) may enable use of a larger number of layers (as the same materials may be used in the thin film layers) compared to having interference filters 106a and 106b with substantially different wavelength transmission characteristics.

The use of a plurality of interference filters 106a-d enables flexibly designing a combined wavelength transmission characteristic defining the wavelengths detected by the photo-sensitive area 104a. Below, some embodiments of making use of the flexibility will be described.

In a first embodiment, the image sensor 100 may be used for acquiring hyperspectral image information, wherein each photo-sensitive area 104 is configured to detect light in a narrow wavelength band. Several different wavelength bands within the visible region (or possibly extending into ultraviolet and/or near infrared regions) may be defined and detected by the different photo-sensitive areas 104.

However, the bandwidth of the wavelength bands defined by an interference filter may depend on the central wavelength of the wavelength band such that a broader bandwidth is provided for longer wavelengths. According to the first embodiment, the plurality of interference filters 106a-d is used for accurately controlling the bandwidth of the combined wavelength transmission reaching the photo-sensitive areas 104 such that similar bandwidths may be provided independently of the central wavelength of the wavelength band being detected by the photo-sensitive area 104. Thus, a hyperspectral image may be acquired with the same or at least similar specificity of the spectral information for all wavelengths that are detected.

Figure 3A:
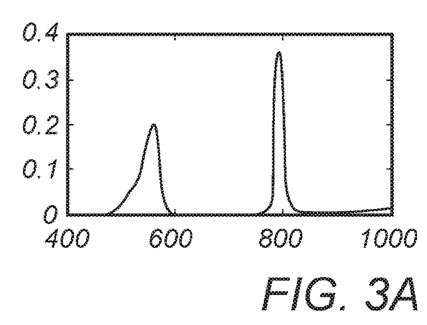
FIG. 3A is a wavelength spectrum illustrating wavelength transmission of a set-up of interference filters of an example image sensor, according to example embodiments.
Figure 3B:
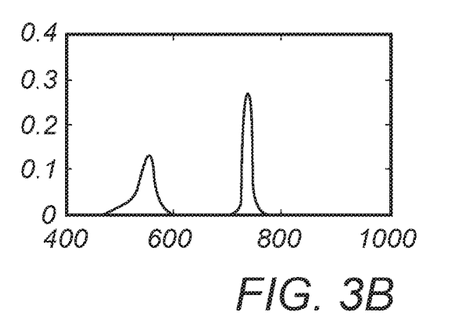
FIG. 3B is a wavelength spectrum illustrating wavelength transmission of a set-up of interference filters of an example image sensor, according to example embodiments.

Referring now to FIGS. 3A and 3B, a second embodiment may use the plurality of interference filters 106a-d in order to define wavelength band being detected by the photo-sensitive area 104 that is broader than a wavelength band that would be defined by a single interference filter.

FIG. 3A shows a combined wavelength spectrum of light being transmitted by four interference filters 106a-d to a single photo-sensitive area 104a. The illustrated wavelength spectrum may be obtained by the four interference filters 106a-d being designed to transmit central wavelengths of 788 nm, 792 nm, 796 nm, and 800 nm, respectively. This implies that a relatively broad bandwidth of transmitted light may be defined. The broad peak between 400 nm and 600 nm corresponds to a leakage from the filters and may be prevented by combining the image sensor 100 with an additional filter blocking these wavelengths, at least for a relevant portion of the array 102 of photo-sensitive areas 104. The additional filter may be arranged in a separate part of an optical set-up and need not be integrated with the image sensor 100.

FIG. 3B shows a combined wavelength spectrum of light being transmitted by four interference filters 106a-d to a single photo-sensitive area 104a. The illustrated wavelength spectrum may be obtained by the four interference filters 106a-d being designed to transmit central wavelengths of 732 nm, 737 nm, 741 nm, and 745 nm, respectively. As illustrated by FIGS. 3A and 3B, different wavelength bands may be defined for different photo-sensitive areas 104 providing flexibility in the bandwidth of the interference filters 106 so that a relatively broad bandwidth of transmitted light may be defined.

In a third embodiment, the image sensor 100 may be used for detecting light from a combination of discrete wavelength bands. The combination of discrete wavelength bands may be designed in relation to a reflection spectrum of a substance of interest. Each photo-sensitive area 104 may thus detect a large intensity of light if a portion of an object imaged by the photo-sensitive area 104 comprises the substance of interest. Hence, the image sensor 100 may be used for quickly classifying portions of an object in relation to presence or absence of a substance.

Figure 4A:
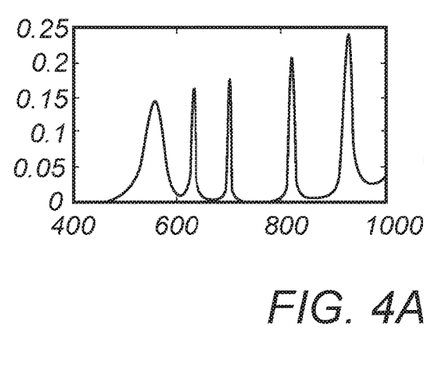
FIG. 4A is a wavelength spectrum illustrating wavelength transmission of a set-up of interference filters of an example image sensor, according to example embodiments.
Figure 4B:
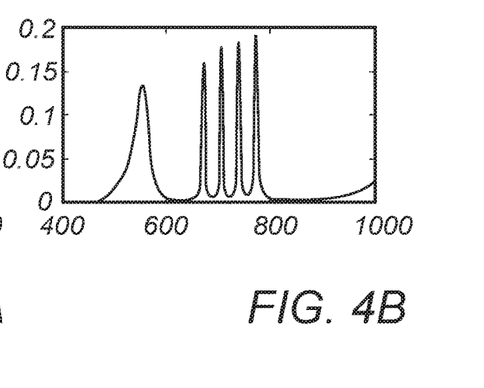
FIG. 4B is a wavelength spectrum illustrating wavelength transmission of a set-up of interference filters of an example image sensor, according to example embodiments.

Referring now to FIGS. 4A and 4B, a fourth embodiment may use the plurality of interference filters 106a-d in order to define different spectral wavelength bands being detected by the different photo-sensitive area 104, which may be used in compressive sensing.

The illustrated wavelength spectrum in FIG. 4A may be obtained by four interference filters 106a-d being designed to transmit central wavelengths of 627 nm, 698 nm, 820 nm, and 928 nm, respectively, for a first photo-sensitive area 104. The illustrated wavelength spectrum in FIG. 4B may be obtained by four interference filters 106a-d being designed to transmit central wavelengths of 672 nm, 706 nm, 741 nm, and 775 nm, respectively, for a second photo-sensitive area 104. Thus, different photo-sensitive areas may be arranged to detect different combinations of spectral wavelengths. By varying the combinations of spectral wavelengths randomly over different photo-sensitive areas 104, compressive sensing may be implemented in which hyperspectral image information may be acquired in a single exposure of the image sensor 100.

It should be realized that the flexibility of designing the wavelength characteristics detected by the photo-sensitive areas 104 may also be used in other manners depending on the application.

In the above disclosure, a limited number of examples have been described. However, as will be readily appreciated, other examples than the ones disclosed above are equally possible within the scope, as defined by the appended claims.

What is claimed is:

1. An image sensor for acquiring an image of an object, comprising:
   an array of photo-sensitive areas formed on a substrate, wherein each photo-sensitive area is a continuous area within the substrate, and
   wherein each photo-sensitive area is configured to detect incident light; and
   an array of interference filters,
   wherein each interference filter is configured to selectively transmit a wavelength band,
   wherein the array of interference filters is monolithically integrated on the array of photo-sensitive areas,
   wherein a plurality of the interference filters is associated with a single photo-sensitive area of the array of photo-sensitive areas, and
   wherein each interference filter in the plurality of interference filters is configured to selectively transmit a unique wavelength band to the photo-sensitive area and each interference filter in the plurality of interference filters is associated with a respective portion of the single photo-sensitive area.

2. The image sensor according to claim 1, wherein the respective portions of the photo-sensitive area are equal in size.

3. The image sensor according to claim 1, wherein the plurality of interference filters is arranged in a sub-array associated with the single photo-sensitive area.

4. The image sensor according to claim 3, wherein the plurality of interference filters is arranged in a 2×2 set-up of the sub-array.

5. The image sensor according to claim 1, wherein each single photo-sensitive area in the array of photo-sensitive areas is associated with a respective plurality of interference filters.

6. The image sensor according to claim 1,
   wherein each of a first set of photo-sensitive areas is associated with a respective plurality of interference filters, and
   wherein each of a second set of photo-sensitive areas is associated with a respective single interference filter.

7. The image sensor according to claim 6, wherein wavelength transmission characteristics of the respective plurality of interference filters associated with the first set of photo-sensitive areas are different from wavelength transmission characteristics of the respective single interference filters associated with the second set of photo-sensitive areas.

8. The image sensor according to claim 1, wherein the single photo-sensitive area is configured to output a single value based on intensity of detected light transmitted to the single photo-sensitive area by the plurality of interference filters.

9. The image sensor according to claim 1, wherein each interference filter comprises a plurality of thin film layers.

10. The image sensor according to claim 9, wherein the plurality of thin film layers comprises:
    two stacks of layers configured to reflect light; and
    a transparent layer arranged between the two stacks of layers, wherein a thickness of the transparent layer defines the wavelength band transmitted by the interference filter.

11. The image sensor according to claim 1, wherein the plurality of interference filters together define a continuous wavelength band transmitted to the photo-sensitive area and control a bandwidth of the continuous wavelength band around a central wavelength.

12. The image sensor according to claim 11,
    wherein the array of interference filters is configured to define different continuous wavelength bands being transmitted to different photo-sensitive areas, and wherein the plurality of interference filters associated with the single photo-sensitive area is configured to control the bandwidth of the continuous wavelength band such that equal bandwidths are defined for the different photo-sensitive areas.

13. The image sensor according to claim 1, wherein the plurality of interference filters defines a spectrum of discrete wavelength bands being transmitted to the single photo-sensitive area.

14. The image sensor according to claim 13,
wherein a plurality of interference filters is associated with each of a set of photo-sensitive areas, and
wherein the spectrum of discrete wavelength bands transmitted to the single photo-sensitive area varies randomly between different photo-sensitive areas.

15. An imaging apparatus comprising:
an image sensor for acquiring an image of an object, comprising:
an array of photo-sensitive areas formed on a substrate, wherein each photo-sensitive area is a continuous area within the substrate, and
wherein each photo-sensitive area is configured to detect incident light; and
an array of interference filters,
wherein each interference filter is configured to selectively transmit a wavelength band,
wherein the array of interference filters is monolithically integrated on the array of photo-sensitive areas,
wherein a plurality of the interference filters is associated with a single photo-sensitive area of the array of photo-sensitive areas, and
wherein each interference filter in the plurality of interference filters is configured to selectively transmit a unique wavelength band to the photo-sensitive area and each interference filter in the plurality of interference filters is associated with a respective portion of the single photo-sensitive area.

16. The imaging apparatus according to claim 15, wherein the respective portions of the photo-sensitive area are equal in size.

17. The imaging apparatus according to claim 15, wherein the plurality of interference filters is arranged in a sub-array associated with the single photo-sensitive area.

18. The imaging apparatus according to claim 17, wherein the plurality of interference filters is arranged in a 2×2 set-up of the sub-array.

19. The imaging apparatus according to claim 15, wherein each single photo-sensitive area in the array of photo-sensitive areas is associated with a respective plurality of interference filters.

20. The imaging apparatus according to claim 15,
wherein each of a first set of photo-sensitive areas is associated with a respective plurality of interference filters, and
wherein each of a second set of photo-sensitive areas is associated with a respective single interference filter.

* * * * *